(12) United States Patent
Hammond

(10) Patent No.: US 8,988,860 B2
(45) Date of Patent: Mar. 24, 2015

(54) POWER SUPPLIES HAVING POWER ELECTRONIC MODULES AND REPLACEMENT METHODS THEREOF

(71) Applicant: Peter Willard Hammond, Greensburg, PA (US)

(72) Inventor: Peter Willard Hammond, Greensburg, PA (US)

(73) Assignee: Siemens Aktiengesellschaft, München (DE)

( * ) Notice: Subject to any disclaimer, the term of this patent is extended or adjusted under 35 U.S.C. 154(b) by 329 days.

(21) Appl. No.: 13/688,327

(22) Filed: Nov. 29, 2012

(65) Prior Publication Data

US 2014/0146486 A1   May 29, 2014

(51) Int. Cl.
*H02B 13/02* (2006.01)
*H05K 13/04* (2006.01)
*H02M 7/00* (2006.01)
*H05K 7/14* (2006.01)

(52) U.S. Cl.
CPC ........... *H05K 13/0486* (2013.01); *H02M 7/003* (2013.01); *H05K 7/1432* (2013.01)
USPC ........... 361/614; 361/603; 439/135; 439/136; 439/137

(58) Field of Classification Search
CPC .. H05K 13/0486; H05K 7/1432; H02M 7/003
USPC ........... 361/602, 603, 614; 439/135, 136, 137
See application file for complete search history.

(56) References Cited

U.S. PATENT DOCUMENTS

| | | | | |
|---|---|---|---|---|
| 3,562,593 A | * | 2/1971 | Bould | 361/614 |
| 3,717,805 A | * | 2/1973 | Gnaedinger et al. | 363/13 |
| 4,133,994 A | * | 1/1979 | Rozier et al. | 200/307 |
| 4,482,936 A | * | 11/1984 | Saito | 361/606 |
| 4,993,962 A | * | 2/1991 | Noda et al. | 439/136 |
| 5,038,808 A | * | 8/1991 | Hammond et al. | 134/184 |
| 5,161,988 A | * | 11/1992 | Krupka | 439/136 |
| 5,245,527 A | * | 9/1993 | Duff et al. | 363/131 |
| 5,610,493 A | * | 3/1997 | Wieloch | 318/801 |
| 5,625,545 A | * | 4/1997 | Hammond | 363/71 |

(Continued)

FOREIGN PATENT DOCUMENTS

EP   1903848 A2   3/2008

OTHER PUBLICATIONS

PCT Invitation mailed Feb. 3, 2014 corresponding to PCT International Application No. PCT/US2013/068249 filed Nov. 4, 2013 (6 pages).

(Continued)

*Primary Examiner* — David M Sinclair
*Assistant Examiner* — Robert Brown

(57) ABSTRACT

A power supply having one or more power electronic modules that may be replaced without shutting down the power supply. Each power electronic module may be enclosed in a separate compartment of the power supply. Each compartment may have stationary electrical connectors configured to electrically connect to the power electronic module. A racking mechanism connected to a handle outside the compartment may move a power electronic module out of electrical contact with the stationary electrical connectors and/or into electrical contact with the stationary electrical connectors. Movement of a power electronic module within the compartment may occur without shutting down the power supply. Methods of replacing power electronic modules without shutting down the power supply are also provided, as are other aspects.

20 Claims, 10 Drawing Sheets

(56) References Cited

U.S. PATENT DOCUMENTS

| | | | | |
|---|---|---|---|---|
| 5,838,533 | A | * | 11/1998 | Yazaryan et al. ............ 361/600 |
| 5,913,926 | A | * | 6/1999 | Anderson et al. ........... 714/6.24 |
| 5,986,909 | A | * | 11/1999 | Hammond et al. ............ 363/65 |
| 6,376,770 | B1 | * | 4/2002 | Hyde ............................ 174/58 |
| 6,443,322 | B1 | * | 9/2002 | Braun et al. ................. 220/4.02 |
| 7,450,368 | B2 | * | 11/2008 | Parker et al. ................. 361/611 |
| 7,486,499 | B2 | * | 2/2009 | Rambo et al. ................ 361/609 |
| 7,551,456 | B2 | * | 6/2009 | Behrens et al. .............. 361/788 |
| 7,568,931 | B2 | * | 8/2009 | Hammond .................... 439/263 |
| 7,573,232 | B2 | * | 8/2009 | Cheng et al. ................. 320/115 |
| 7,643,307 | B2 | * | 1/2010 | Bosco et al. ................. 361/757 |
| 7,652,395 | B2 | * | 1/2010 | Von Arx et al. ............... 307/112 |
| 7,749,003 | B2 | * | 7/2010 | Omori .......................... 439/137 |
| 7,800,254 | B2 | * | 9/2010 | Hammond .................... 307/140 |
| 8,093,764 | B2 | * | 1/2012 | Hammond .................... 307/140 |
| 8,130,501 | B2 | * | 3/2012 | Ledezma et al. ............. 361/727 |
| 8,207,812 | B2 | * | 6/2012 | Roc et al. ..................... 336/205 |
| 8,441,147 | B2 | * | 5/2013 | Hammond ..................... 307/29 |
| 8,568,301 | B2 | * | 10/2013 | Watanabe et al. ............ 600/132 |
| 2002/0106919 | A1 | * | 8/2002 | Behl ............................. 439/136 |
| 2003/0063431 | A1 | * | 4/2003 | Sobolewski .................. 361/600 |
| 2003/0124889 | A1 | * | 7/2003 | Yamaguchi et al. .......... 439/137 |
| 2004/0223301 | A1 | * | 11/2004 | Muller et al. ................. 361/699 |
| 2005/0036248 | A1 | * | 2/2005 | Klikic et al. .................... 361/42 |
| 2006/0063434 | A1 | * | 3/2006 | Bergmann et al. ............ 439/638 |
| 2006/0250755 | A1 | * | 11/2006 | Tilton et al. ................... 361/600 |
| 2007/0111575 | A1 | * | 5/2007 | Jensen et al. .................. 439/246 |
| 2007/0183130 | A1 | * | 8/2007 | Yamabuchi et al. .......... 361/728 |
| 2007/0217125 | A1 | * | 9/2007 | Johnson ........................ 361/600 |
| 2007/0293066 | A1 | * | 12/2007 | Hynds et al. .................. 439/135 |
| 2008/0079314 | A1 | * | 4/2008 | Hammond ...................... 307/43 |
| 2008/0081244 | A1 | * | 4/2008 | Hammond ....................... 429/61 |
| 2008/0083547 | A1 | * | 4/2008 | Pinol Pedret et al. ........... 174/50 |
| 2008/0084148 | A1 | * | 4/2008 | Talja .......................... 312/223.6 |
| 2010/0188813 | A1 | * | 7/2010 | Nakatsu et al. ............... 361/689 |
| 2010/0203746 | A1 | * | 8/2010 | Kita ............................. 439/76.1 |
| 2011/0044010 | A1 | * | 2/2011 | Ledezma et al. ............. 361/727 |
| 2012/0113582 | A1 | * | 5/2012 | Hirano et al. ............. 361/679.33 |
| 2013/0178089 | A1 | * | 7/2013 | Tajima ......................... 439/304 |
| 2014/0104759 | A1 | * | 4/2014 | Takano ......................... 361/637 |
| 2014/0133070 | A1 | * | 5/2014 | Yoshikawa ................... 361/624 |
| 2014/0140119 | A1 | * | 5/2014 | Shinohara et al. ............ 363/141 |
| 2014/0192455 | A1 | * | 7/2014 | Yoshida et al. ............... 361/605 |

OTHER PUBLICATIONS

PCT International Search Report mailed Jun. 23, 2014 corresponding to PCT International Application No. PCT/US2013/068249 filed Nov. 4, 2013 (17 pages).

* cited by examiner

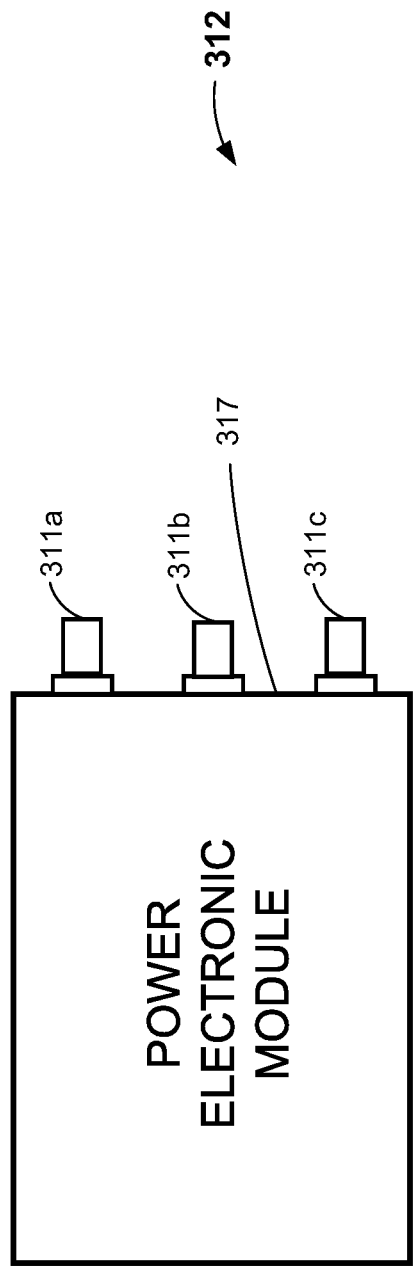
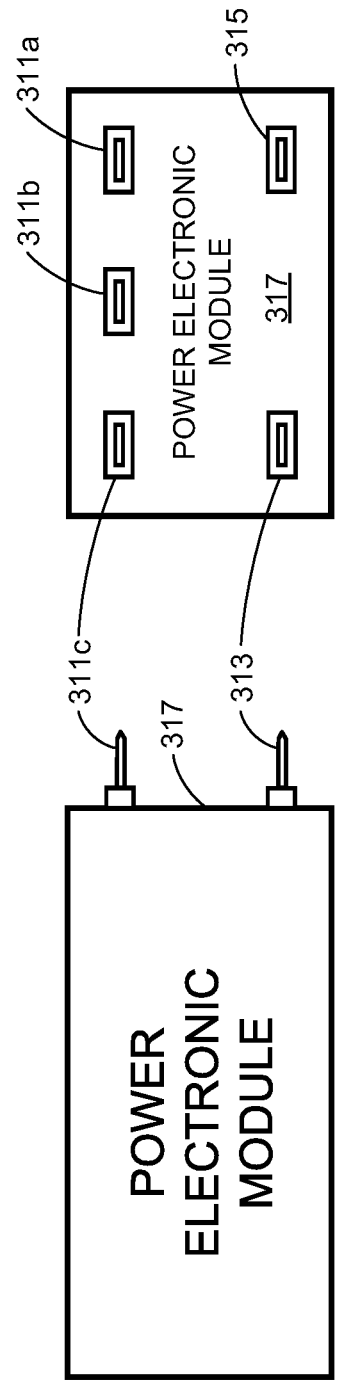
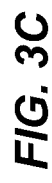
FIG. 3A
FIG. 3B
FIG. 3C

POWER SUPPLIES HAVING POWER ELECTRONIC MODULES AND REPLACEMENT METHODS THEREOF

FIELD

The invention relates generally to power supplies, and more particularly to power supplies having one or more power electronic modules.

BACKGROUND

Power supplies may be constructed with one or more power electronic modules that provide an output voltage of the power supply. Each power electronic module may have several power connections configured to electrically connect to, e.g., a transformer, another power electronic module, and/or an external load of the power supply. The load may be, e.g., an AC motor. If one or more power electronic modules fail, some power supplies may continue to operate at a reduced voltage. However, replacing a failed power electronic module usually requires shutting down the power supply to avoid possible risk of injury or death from accidental contact with a live power connection. Shutting down a power supply may be very disruptive and/or costly in many industrial applications. Accordingly, a need exists to provide a power supply that may continue to operate while power electronic modules are safely replaced.

SUMMARY

According to one aspect, an improved power supply is provided. The power supply includes a compartment configured to enclose a power electronic module therein, the compartment including a plurality of walls completely enclosing the compartment, wherein each of the plurality of walls has an electrically grounded or insulated inside surface and one of the plurality of walls comprises an electrically grounded or insulated door providing access to inside of the compartment, a plurality of stationary electrical connectors, an insulated shutter having a first position configured to inhibit electrical contact with the plurality of stationary electrical connectors and a second position configured to allow electrical contact with the plurality of stationary electrical connectors, and a racking mechanism configured to move a power electronic module into and/or out of electrical contact with the stationary electrical connectors.

According to another aspect, a second improved power supply is provided. The power supply includes a transformer, a plurality of power electronic modules each electrically coupled to the transformer and each configured to provide an output voltage, and a plurality of compartments each enclosing a respective one of the plurality of power electronic modules and each comprising: a plurality of stationary electrical connectors electrically connected to a respective one of the plurality of power electronic modules, and a shutter having a first position inhibiting electrical contact with the plurality of stationary electrical connectors and a second position allowing electrical contact with the plurality of stationary electrical connectors wherein at least one of the plurality of power electronic modules is configured to move away and electrically disconnect from a respective one of the plurality of stationary electrical connectors while at least one other of the plurality of power electronic modules provides an output voltage, and the shutter is configured to move into the first position in response to the at least one of the plurality of power electronic modules moving away and electrically disconnecting from the respective one of the plurality of stationary electrical connectors.

According to yet another aspect, a method of replacing a power electronic module in a power supply is provided. The method includes powering up a power supply to output a voltage, moving a first power electronic module to electrically disconnect the first power electronic module from a plurality of stationary electrical connectors while the power supply outputs a voltage, opening a door to a compartment enclosing the first power electronic module to remove the first power electronic module from the compartment while the power supply outputs a voltage, closing the door after a second power electronic module has been placed in the compartment while the power supply outputs a voltage, and moving the second power electronic module to electrically connect the second power electronic module to the plurality of stationary electrical connectors while the power supply outputs a voltage.

Still other aspects, features, and advantages of the invention may be readily apparent from the following detailed description wherein a number of example embodiments and implementations are described and illustrated, including the best mode contemplated for carrying out the invention. The invention may also be capable of other and different embodiments, and its several details may be modified in various respects, all without departing from the scope of the invention. Accordingly, the drawings and descriptions are to be regarded as illustrative in nature, and not as restrictive. The drawings are not necessarily drawn to scale. The invention covers all modifications, equivalents, and alternatives falling within the scope of the invention.

BRIEF DESCRIPTION OF DRAWINGS

FIGS. 3A, 3B, and 3C illustrate top, side, and rear views, respectively, of a power electronic module configured according to embodiments.

DETAILED DESCRIPTION

Reference will now be made in detail to the example embodiments of this disclosure, which are illustrated in the accompanying drawings. Wherever possible, the same reference numbers will be used throughout the drawings to refer to the same or like parts.

The aforementioned problem of providing power supplies that may continue to operate while one or more power electronic modules in the power supply are being safely replaced may be overcome by one or more embodiments of the invention. In one aspect, each power electronic module may be enclosed in its own compartment. The compartment may have electrically grounded and/or insulated inside surfaces and a plurality of stationary electrical connectors. The stationary electrical connectors may include a plurality of power connections including, e.g., outputs from a transformer of the power supply and/or inputs to other power electronic modules and/or an external load being driven by the power supply. A power electronic module connected to the stationary electrical connectors may be moved within the compartment away from the stationary electrical connectors to electrically disconnect therefrom while the power supply may continue to operate. A shutter may inhibit contact with the stationary electrical connectors in response to the power electronic module disconnecting from the stationary electrical conductors. A door to the compartment may then be opened to remove the power electronic module from the compartment while the power supply may continue to operate. After placing a new power electronic module in the compartment, the door may be closed, the shutter may be withdrawn to allow contact with the stationary electrical connectors, and the new power electronic module may be moved within the compartment toward the stationary electrical connectors to electrically connect thereto, again, all while the power supply may continue to operate. The power supply may thus be returned to full operation without having to shut down the power supply while one or more power electronic modules are being replaced. This capability may be referred to as "hot-swapping." In other aspects, methods of replacing a power electronic module in a power supply are provided, as will be explained in greater detail below in connection with FIGS. 1-10.

Figure 1:
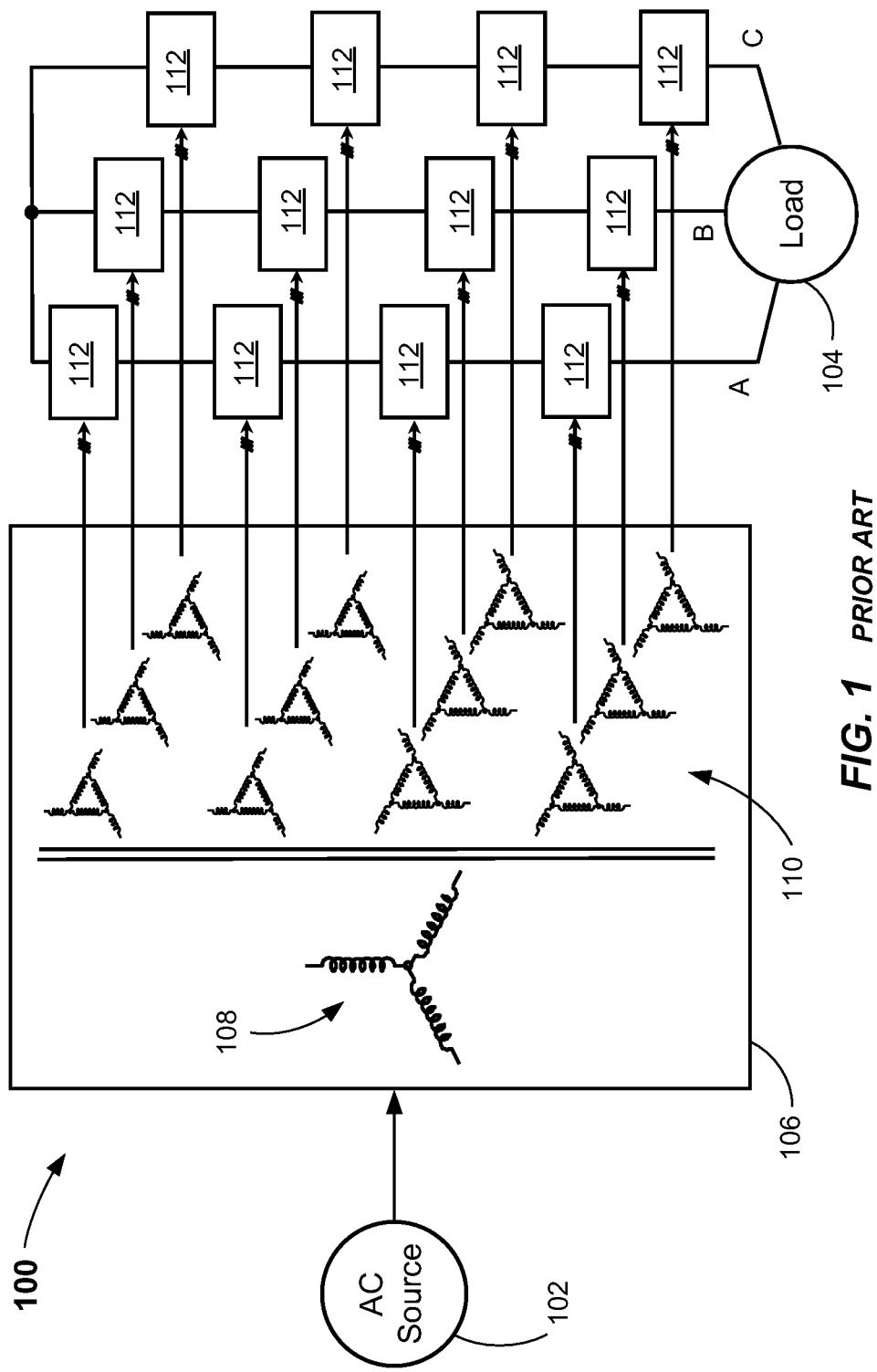
FIG. 1 illustrates a schematic diagram of a power supply having power electronic modules according to the prior art.

FIG. 1 illustrates an example of a known power supply 100. An input power source 102 (e.g., a three-phase AC input) may be coupled to power supply 100. In some embodiments, power supply 100 may be a medium-voltage power supply wherein input power source 102 may provide, e.g., from about 277 volts AC to about 14,000 volts AC. Power supply 100 may provide a variable frequency voltage and may be coupled to a load 104, which may be a motor, e.g., a three-phase AC motor. Alternatively, power supply 100 may be a different suitable type of power supply providing other voltages and/or may be coupled to other suitable sources of input power and/or to other suitable loads.

Power supply 100 may include a transformer 106, which may step down an input voltage. Transformer 106 may include a primary winding 108 and a plurality of secondary windings 110. The primary winding may be, e.g., a star configured circuit (as shown) or a mesh configured circuit. The secondary windings 110 may, in some embodiments, be mesh configured (as shown), which may include some delta configured circuits and/or some extended delta configured circuits. In other embodiments, the secondary windings 110 may be star configured, which may include some WYE configured circuits and/or some zigzag configured circuits. Secondary windings 110 may output three-phase power or single phase power. Transformer 106 may alternatively have other suitably-configured circuits.

Power supply 100 may also include a plurality of power electronic modules 112, which may be identical to each other. Each secondary winding 110 may feed a respective power electronic module 112. In some embodiments, power electronic module 112 may be a variable frequency drive, which may employ pulse width modulation (PWM). In some embodiments, power electronic module 112 may include an input AC-to-DC rectifier, a smoothing filter, and an output DC-to-AC converter. In one or more embodiments, power electronic modules 112 may be configured in three groups wherein the outputs of each power electronic module 112 in each group are connected in series to generate a voltage for one phase (e.g., A, B, or C) of power to load 104. For example, as shown in FIG. 1, power supply 100 may include 12 power electronic modules configured in three groups of four serially-coupled modules. In other embodiments, power supply 100 may include, e.g., 24 power electronic modules configured in three groups of eight serially-coupled modules. Power supply 100 may have other suitable numbers of power electronic modules, which for multi-phase power may be in multiples of the number of output phases. The output voltage provided by each power electronic module 112 in a serially-coupled group may be added to the output voltage of the other power electronic modules of that group to provide an output voltage that may be higher than an input voltage received by power supply 100. In some embodiments, the plurality of power electronic modules 112 may provide output power supply voltages from about 2,300 volts AC to about 14,000 volts AC. Alternatively, the plurality of power electronic modules 112 may have other suitable configurations and may provide other suitable output voltages and/or ranges of output voltages.

An example of a power supply 100 and circuitry for power electronic modules 112 may be described in U.S. Pat. No. 5,625,545, which is hereby incorporated by reference herein.

Figure 2:
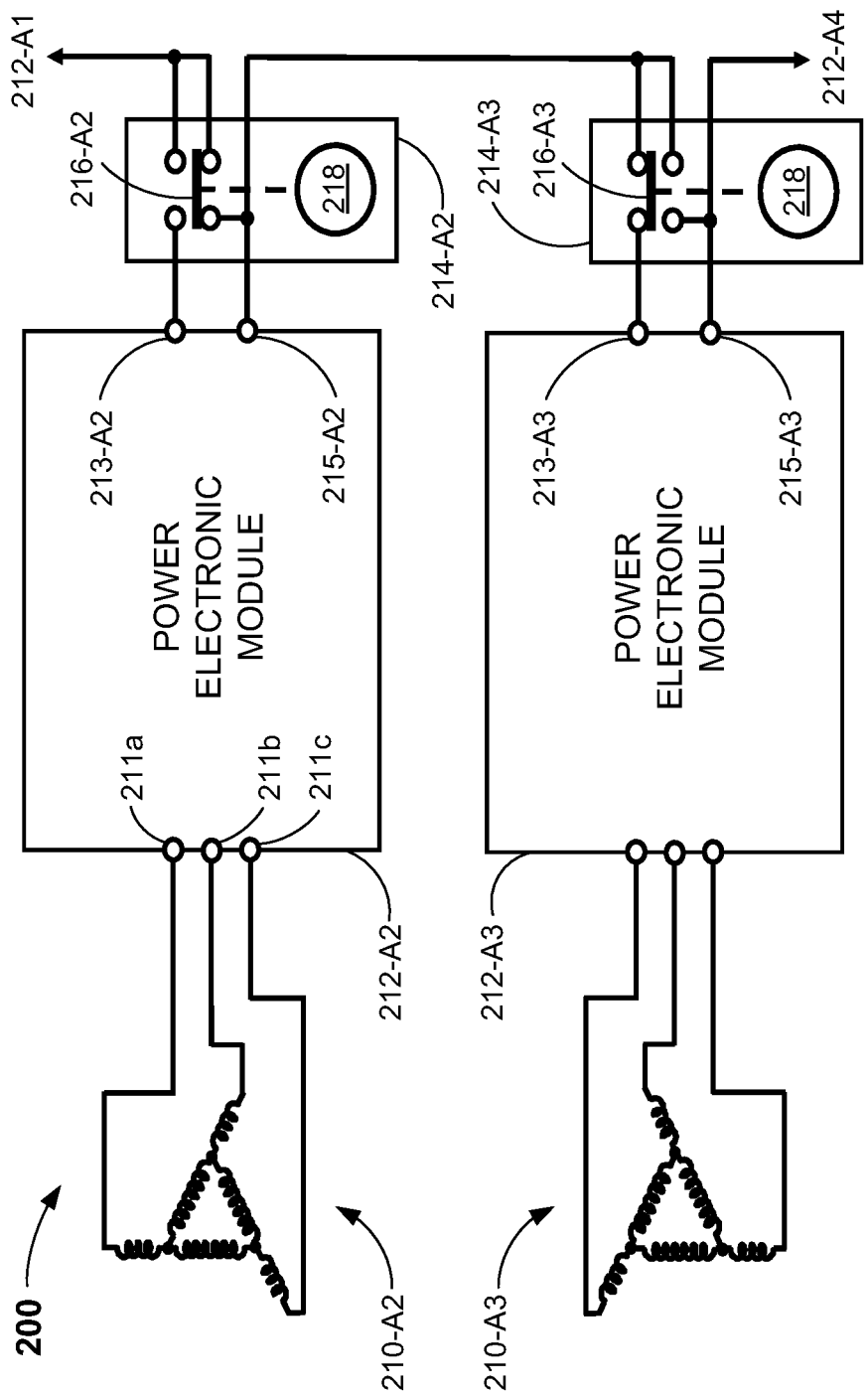
FIG. 2 illustrates a schematic diagram of a portion of a power supply having bypass circuits for power electronic modules according to the prior art.

Power supply 100 may have the advantage that if one or more power electronic modules 112 fails, the failed power electronic module(s) 112 may be electrically bypassed such that power supply 100 may continue to operate, although at a reduced capacity, as described further in connection with FIG. 2.

FIG. 2 shows a portion of a known power supply 200 that may have the capability of electrically bypassing one or more power electronic modules. Power supply 200 may have a plurality of power electronic modules, of which only two serially-connected power electronic modules 212-A2 and 212-A3 are shown. Secondary windings 210-A2 and 210-A3 may provide three-phase power to power electronic modules 212-A2 and 212-A3, respectively. Power electronic module 212-A2 may be coupled to a bypass switch 214-A2, and power electronic module 212-A3 may be coupled to a bypass switch 214-A3. (For purposes of illustration, bypass switch 214-A2 is shown in a bypass mode, while bypass switch 214-A3 is shown in a normal operating mode.) Bypass switch 214-A2 may include a switch 216-A2, and bypass switch 214-A3 may include a switch 216-A3. Switches 216-A2 and 216-A3 may each be controlled by a respective solenoid 218. Power electronic module 212-A2 may receive an output voltage from a power electronic module 212-A1 (not shown) at input terminal 213-A2 via bypass switch 214-A2. Power electronic module 212-A2 may output a voltage, which may additively include the voltage received from power electronic module 212-A1, at output terminal 215-A2. Similarly, power electronic module 212-A3 may receive an output voltage from power electronic module 212-A2 at input terminal 213-A3 via bypass switch 214-A3. Power electronic module 212-A3 may output a voltage, which may additively include the voltage received from power electronic module 212-A2, at output terminal 215-A3. The output voltage from power electronic module 212-A3 may be fed via bypass switch 214-A3 to a power electronic module 214-A4 (not shown). This process may continue for other serially-connected power electronic modules of that group.

Power supply 200 may continue to operate if one or more power electronic modules fail (e.g., a power electronic module outputs no voltage). For example, if power electronic module 212-A2 were to fail, control circuitry in power supply 200 may cause switch 216-A2 of bypass switch 214-A2 to switch into bypass mode, as shown in FIG. 2. Output voltage from power electronic module 212-A1 would then bypass the defective power electronic module 212-A2 and would be received instead by power electronic module 212-A3 via bypass switch 214-A3, wherein switch 216-A3 is set in normal operating mode, as shown in FIG. 2. Power supply 200 may therefore continue operating, although at a reduced capacity (i.e., minus the voltage contribution of power electronic module 212-A2).

An example of a power supply 200 having bypass and control circuitry capable of bypassing one or more failed power electronic modules may be described in U.S. Pat. No. 5,986,909, which is hereby incorporated by reference herein.

Power supply 200, however, may need to be powered down in order to safely remove and/or replace a power electronic module. As shown in FIG. 2, each power electronic module may have a plurality of power connections. For example, power electronic module 212-A2 may have four input power connections 211a, 211b, 211c, and 213-A2 and one output power connection 215-A2. Power electronic modules may also have one or more control signal connections (not shown). These connections are likely made manually and with hand tools (e.g., screwdriver, pliers, wrench, wire cutters, etc.). Accordingly, there is a possible risk of injury or death if contact occurs with a live power connection. Therefore, power supply 200 may be shut down to de-energize the power connections in order to safely remove and/or replace a power electronic module.

FIGS. 3A-3C illustrate a power electronic module 312 that may be safely removed and/or replaced while the power supply may continue to operate in accordance with one or more embodiments. Power electronic module 312 may have a plurality of electrical connectors located on a rear surface 317. The electrical connectors may include both input and output power connections. For example, power electronic module 312 may include electrical connectors 311a, 311b, 311c, 313, and 315, of which electrical connectors 311a, 311b, 311c, and 313 may be input power connections and electrical connector 315 may be an output power connection. While five power connections are shown, the number of power connections in other embodiments may be more or less than five. Electrical connectors 311a, 311b, 311c, 313, and 315 may be slide in connectors and may be connectable without hand tools and may be, e.g., metal blade connectors as shown, sized in accordance with an amount of current they are expected to conduct. In other embodiments, electrical connectors 311a, 311b, 311c, 313, and 315 may have other connector configurations that do not require hand tools for connection, such as, e.g., a pin and socket configuration and/or any other suitable plug-in type configuration. Electrical connectors 311a, 311b, 311c, 313, and 315 may be a male or female type of connector and may be made of any suitable electrically conductive material. Electrical connectors for control signals (not shown) may in some embodiments also be located on rear surface 317, and may also be connectable without hand tools. Control signal connectors may have similar or identical connectors as the power connections and/or may use other suitable signaling technologies such as infrared signaling.

Figure 4:
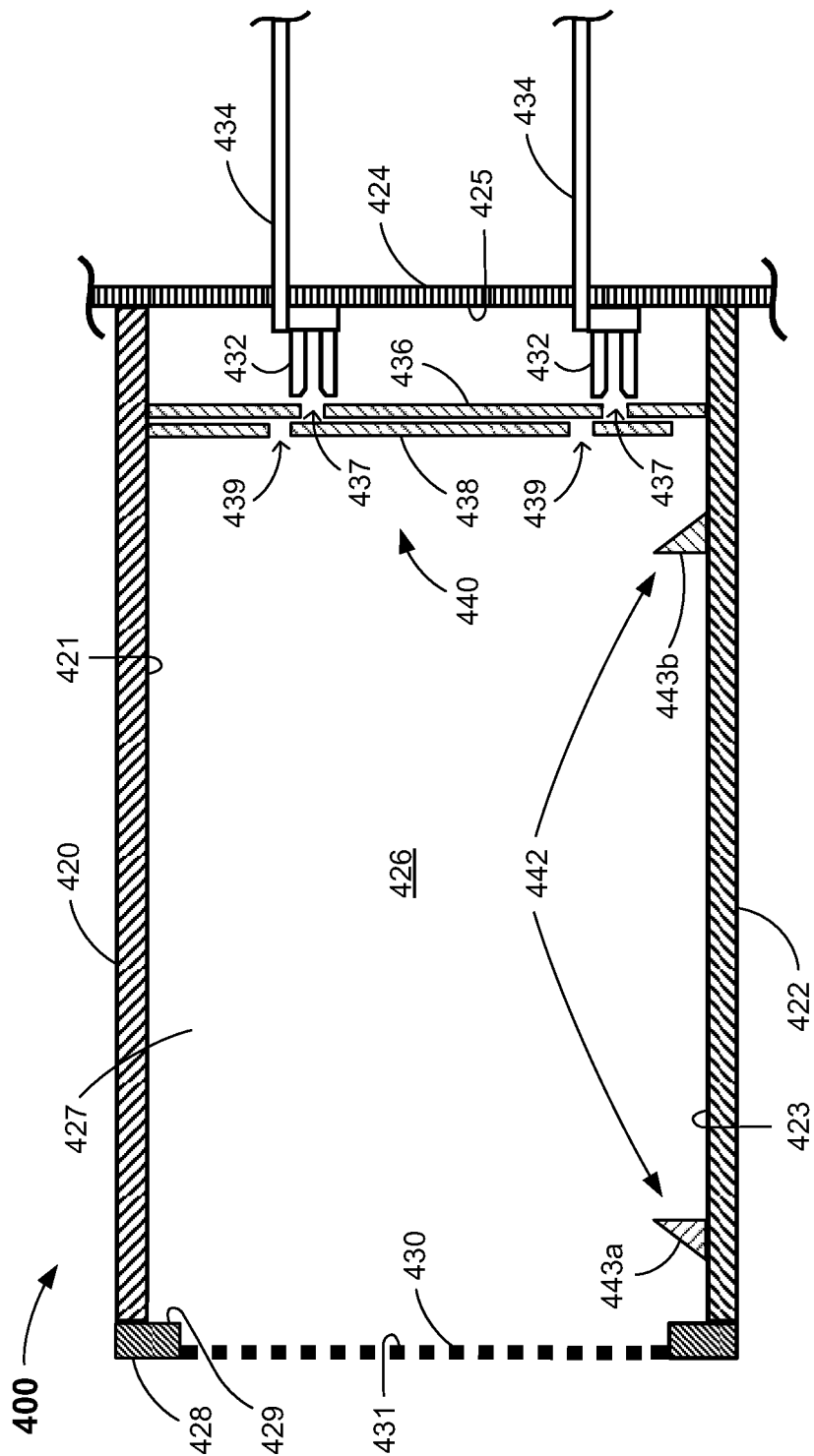
FIG. 4 illustrates a cross-sectional side view of a compartment of a power supply configured to enclose a single power electronic module according to embodiments.

FIG. 4 illustrates a compartment 400 of a power supply that may be configured to enclose a single power electronic module in accordance with one or more embodiments. Compartment 400 may have a rectangular shape but, alternatively, may have other suitable shapes. Compartment 400 may include a plurality of walls, such as, e.g., top wall 420, bottom wall 422, back wall 424, a pair of side walls 426 (of which only one is shown), and a front wall 428 comprising a door 430 (which is represented in FIG. 4 by a dotted line to indicate that door 430 is open and accordingly provides access to the inside of compartment 400). Each of the walls 420, 422, 424, 426, and 428 and door 430, and in particular, inside surfaces 421, 423, 425, 427, 429, and 431, may be made of electrically-grounded metal and/or, in some embodiments, such as those used in low voltage applications, made of or covered by a suitable insulated material. Any suitable electrically-grounded metal, such as, e.g., 11 gauge sheet metal, and/or any suitable insulated material, such as, e.g., a suitable plastic, may be used to construct compartment 400. Note that, in some embodiments, the construction of compartment 400 with insulated materials may only be suitable for low voltage applications.

Compartment 400 may also include a plurality of stationary electrical connectors 432 extending through or coupled to the back wall 424. The stationary electrical connectors 432 may be configured to receive and electrically connect to some or all of the electrical connectors of a power electronic module, such as, e.g., electrical connectors 311a, 311b, 311c, 313, and 315 of power electronic module 312 (as described in more detail below in connection with FIGS. 6-10). In some embodiments, the stationary electrical connectors 432 may be configured as shown in FIG. 4 to receive metal blade electrical connectors. The stationary electrical connectors 432 and the electrical connectors of power electronic module 312 may alternatively have other suitable plug-in configurations, including, e.g., a suitable pin and socket configuration. In some embodiments, the stationary electrical connectors 432 may be any suitable slide-in type and/or combination of female and/or male connectors configured to electrically connect without hand tools to compatible and/or corresponding types of male and/or female connectors, respectively, of power electronic module 312. Electrical connections outside of compartment 400 may be made to the stationary electrical connectors 432 via electrical conductors 434, which may be, e.g., bus bars or cables.

Compartment 400 may further include a stationary shutter 436 and a movable shutter 438 positioned in front of stationary electrical connectors 432. In some embodiments, stationary shutter 436 may be optional. Shutters 436 and 438 may each be made of an insulating material and may each have a pattern of slots and/or holes 437 and 439 to allow the electrical connectors of power electronic module 312 to pass there through and electrically connect to stationary electrical connectors 432. Movable shutter 438 may have a first position 440, as shown in FIG. 4, configured to inhibit electrical contact with the stationary electrical connectors 432. That is, the pattern of slots and/or holes 439 of movable shutter 438 may not line up with the pattern of slots and/or holes 437 of stationary shutter 436 and/or the stationary electrical connectors 432. This may prevent accidental contact with the stationary electrical connectors 432, which may therefore provide a safer environment for installing and removing a power electronic module in compartment 400. Movable shutter 438 may be in first position 440 whenever the stationary electrical connectors 432 are not connected to power electronic module 312. Movable shutter 438 may also have a second position configured to allow electrical contact with the stationary electrical connectors 432. That is, the pattern of slots and/or holes 439 of movable shutter 438 may line up with the pattern of slots and/or holes 437 of stationary shutter 436 and/or the stationary electrical connectors 432, as described below in connection with FIGS. 8 and 9.

Compartment 400 may also include a racking mechanism 442 that may be configured to move a power electronic module 312 placed in compartment 400 toward the stationary electrical connectors 432 to electrically connect power electronic module 312 to the stationary electrical connectors 432. Racking mechanism 442 may also be configured to move power electronic module 312 away from the stationary electrical connectors 432 to disconnect power electronic module 312 from the stationary electrical connectors 432. Racking mechanism 442 may include a pair of movable guides 443a and 443b that may be configured to move a power electronic module 312 back and forth along bottom wall 422. That is, movable guide 443a may move power electronic 312 toward the stationary electrical connectors 432 as both movable guides 443a and 443b move toward back wall 424, and movable guide 443b may move power electronic 312 away from the stationary electrical connectors 432 as both movable guides 443a and 443b move toward front wall 428 and door 430. Racking mechanism 442 may alternatively be configured to move a power electronic module 312 in any other suitable manner, which may include, e.g., any suitable type of reciprocating conveyor belt, continuous track system, moving platform, and/or other mechanism.

Figure 5:
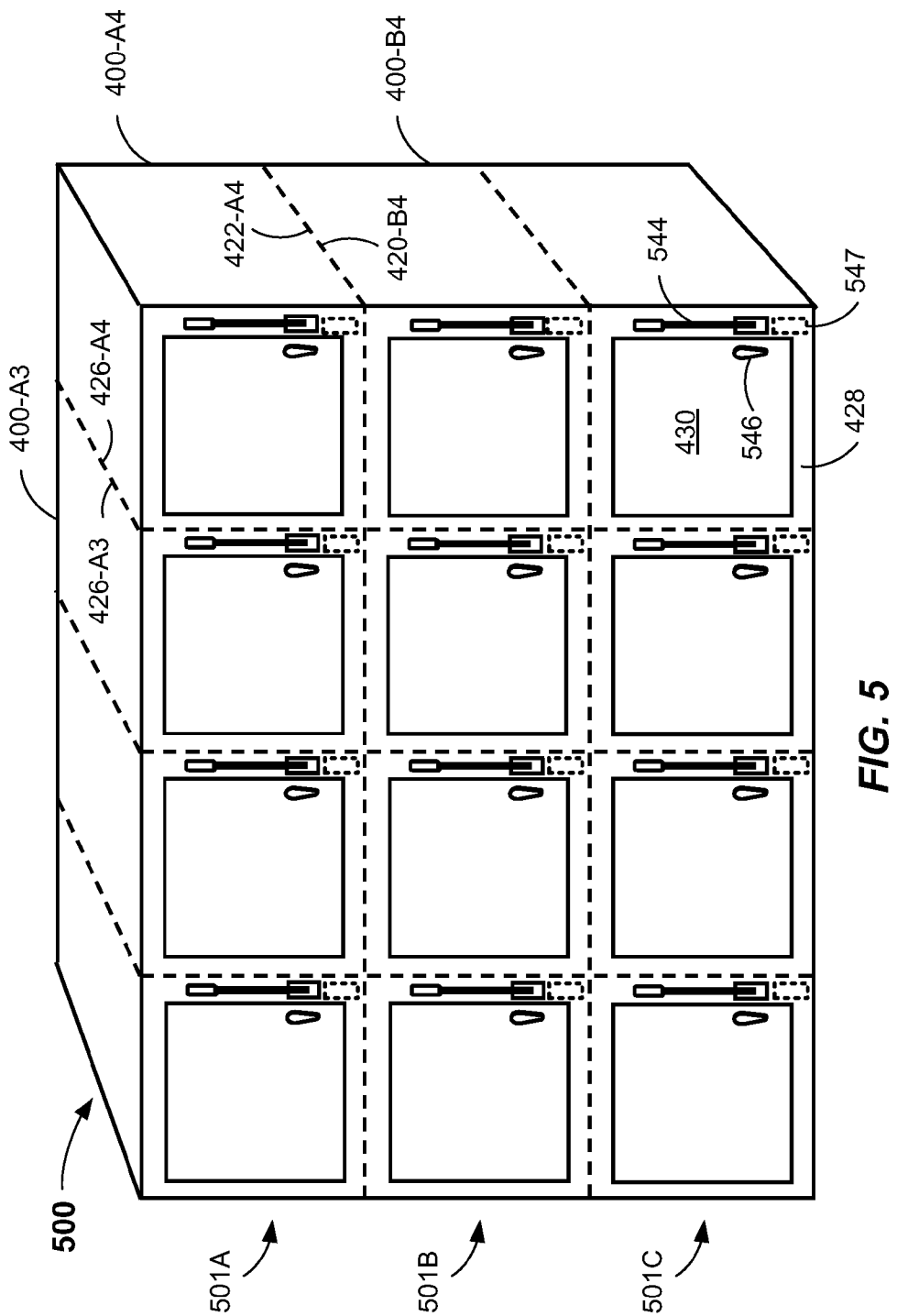
FIG. 5 illustrates a perspective view of a plurality of compartments of a power supply according to embodiments.

FIG. 5 illustrates a plurality of compartments 400 (of which three are labeled in FIG. 5 as 400-A3, 400-A4, and 400-B4) that may form an enclosure 500 of a power supply in accordance with one or more embodiments. Each of the compartments 400 may be identical or substantially identical to each other. Enclosure 500 may include all the power electronic modules of the power supply (other components of the power supply, such as, e.g., a transformer and/or control system, are not shown in FIG. 5). Each compartment 400 may be configured to enclose a single power electronic module, which may be, e.g., power electronic module 312. Enclosure 500 may include, as shown, twelve compartments 400 that may be arranged in three rows 501A, 501B, and 501C of four compartments 400 each. Each of rows 501A, 501B, and 501C may comprise, e.g., a group of serially-connected power electronic modules for generating a voltage for one phase of power, such as the arrangement of power electronic modules 112 of power supply 100. Alternatively, enclosure 500 may have other numbers and arrangements of compartments 400.

In some embodiments, enclosure 500 may be constructed such that a top wall of one compartment 400 may form the bottom wall of an adjacent compartment 400 above, and the bottom wall of one compartment 400 may form the top wall of another adjacent compartment 400 below. For example, bottom wall 422-A4 of compartment 400-A4 may also be top wall 420-B4 of compartment 400-B4 below. Similarly, a right side wall of one compartment 400 may form a left side wall of an adjacent compartment 400 and vice versa. For example, right side wall 426-A3 of compartment 400-A3 may also be left side wall 426-A4 of compartment 400-A4. Alternatively, enclosure 500 may be constructed such that no walls, or only some walls, of adjacent compartments 400 are shared.

Each compartment 400 of enclosure 500 may include a handle 544 that may be located outside the compartment on front wall 428. Handle 544 may made of a grounded metal or an insulating material, and may be configured to operate racking mechanism 442, as described below in connection with FIGS. 6-10. In some embodiments, handle 544 may operate as a lever capable of moving through an arc of, e.g., 180 degrees, which may be calibrated to cause racking mechanism 442 to move a power electronic module 312 through a maximum length of travel in one direction in compartment 400 (e.g., towards the stationary electrical connectors 432). Reverse movement of handle 544 through the same arc may cause racking mechanism to move a power electronic module 312 through a same maximum length of travel in the opposite direction in compartment 400. Handle 544 may alternatively operate racking mechanism 442 through arcs of other suitable degrees or in other suitable manners. In some embodiments, handle 544 may be mechanically connected to racking mechanism 442 via a rack and gear configuration. For example, handle 544 may be mechanically connected to a gear shaft, which may in turn be mechanically connected to a rack. The rack may be part of racking mechanism 442 and/or may be configured to otherwise move, e.g., the movable guides 443a and 443b in each of two directions (i.e., toward and away from the stationary electrical connectors 432). Other suitable rack and pinion type mechanisms may be used. Alternatively, handle 544 may be operatively connected mechanically, electronically, or otherwise to racking mechanism 442 in any suitable manner that causes racking mechanism 442 to provide a back and forth reciprocating linear motion controlled by handle 544. In some embodiments, in addition to handle 544, each compartment 400 of enclosure 500 may include a rotary socket, which may allow a motorized racking device to be connected.

Each compartment 400 of enclosure 500 may also include a door latch 546 of door 430. Door latch 546 may be operatively connected to and/or may be part of an interlock mechanism 547 that may prevent door 430 from opening or unlatching unless a power electronic module 312 is disconnected from the stationary electrical conductors 432 of that compartment 400. Interlock mechanism 547 may also prevent door 430 from opening or unlatching unless movable shutter 438 of that compartment 400 is in first position 440, which may inhibit electrical contact with the stationary electrical connectors 432. In some embodiments, interlock mechanism 547 may also prevent movable shutter 438 from moving into the second position, which may allow electrical contact with the stationary electrical connectors 432, unless door 430 is closed and latched. In some embodiments, interlock mechanism 547 may further prevent handle 544 and/or racking mechanism 442 from operating unless door 430 is closed and latched and/or movable shutter 438 is in the second position. Interlock mechanism 547 may provide other suitable interlocking functions and may be configured mechanically, electronically, or otherwise in any suitable manner with door latch 546, racking mechanism 442, and movable shutter 438.

FIGS. 6-9 illustrate a sequence of events that may allow a power electronic module 312 in a compartment 400 of a power supply to be installed while the power supply may continue to operate in accordance with one or more embodiments. The illustrated sequence may be reversed to remove a power electronic module 312 from a compartment 400 of a power supply while the power supply may continue to operate in accordance with one or more embodiments. In some embodiments, power electronic module 312 may include bypass switches, such as, e.g., bypass switches 214-A2 and 214-A3, which may have to be set in bypass mode before power electronic module 312 may be moved to connect and/or disconnect the power electronic module 312 to and from stationary electrical connectors 432.

Figure 6:
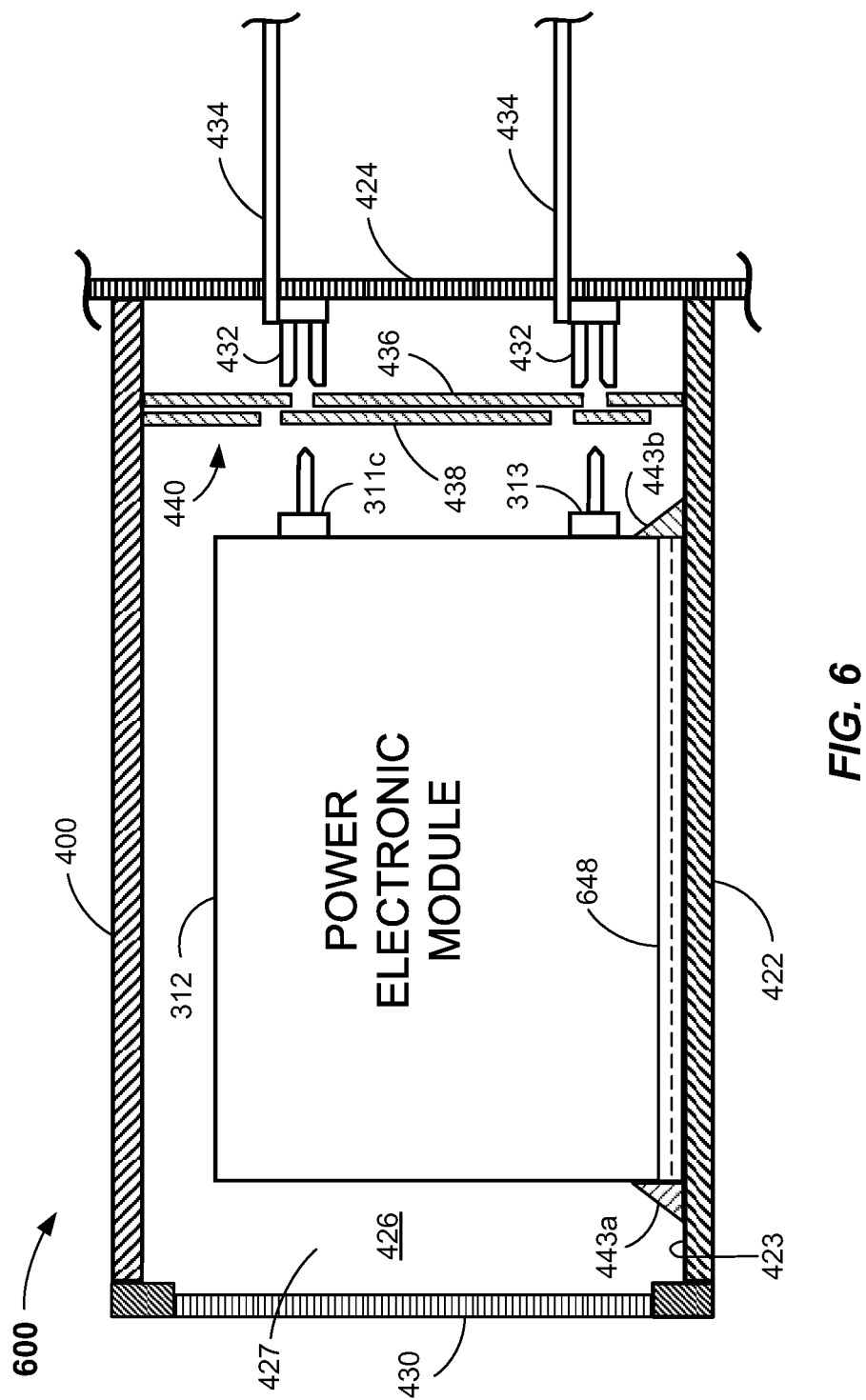
FIG. 6 illustrates a cross-sectional side view of a compartment and power electronic module of a power supply in a disconnected mode according to embodiments.

FIG. 6 illustrates a compartment 400 and a power electronic module 312 in a disconnected mode 600 in accordance with one or more embodiments. Power electronic module 312 may be placed in compartment 400 between movable guides 443a and 443b of racking mechanism 442. In some embodiments, compartment 400 and/or racking mechanism 442 may include a slider 648 slidingly positioned on or adjacent to bottom wall 422 between guides 443a and 443b. In some embodiments, guides 443a and 443b may push slider 648 back and forth, respectively, along bottom wall 422, wherein surfaces of slider 648 that may contact inside surface 423 of bottom wall 422 may have a suitable electrically-safe lubricant applied to reduce any sliding friction that may occur there between. In other embodiments, slider 648 may be slidingly positioned in compartment 400 in any suitable manner, including, e.g., by inserting outside side edges of slider 648 in or on corresponding grooves or ledges (not shown) formed in or on the inside surfaces 427 of side walls 426. In alternative embodiments, slider 648 may be attached to one or more parts of racking mechanism 442, such as, e.g., to a belt or track. Slider 648 may be constructed from a single piece of suitable plastic or other non-conductive material.

With power electronic module 312 placed in compartment 400 and engaged with racking mechanism 442, compartment door 430 may be closed and latched. Electrical connectors 311a, 311b, 311c, 313, and 315 of power electronic module 312 (of which only electrical connectors 311c and 313 are shown in FIG. 6) may be aligned with the stationary electrical connectors 432, but may not yet engage the stationary electrical connectors 432 because movable shutter 438 may be in first position 440, which may inhibit electrical contact with the stationary electrical connectors 432. That is, the pattern of slots and/or holes 439 of movable shutter 438 may not line up with the pattern of slots and/or holes 437 of stationary shutter 436 and/or the stationary electrical connectors 432. Additionally, in some embodiments, interlock mechanism 547 may prevent racking mechanism 442 from moving power electronic module 312 while movable shutter 438 is in first position 440.

Figure 7:
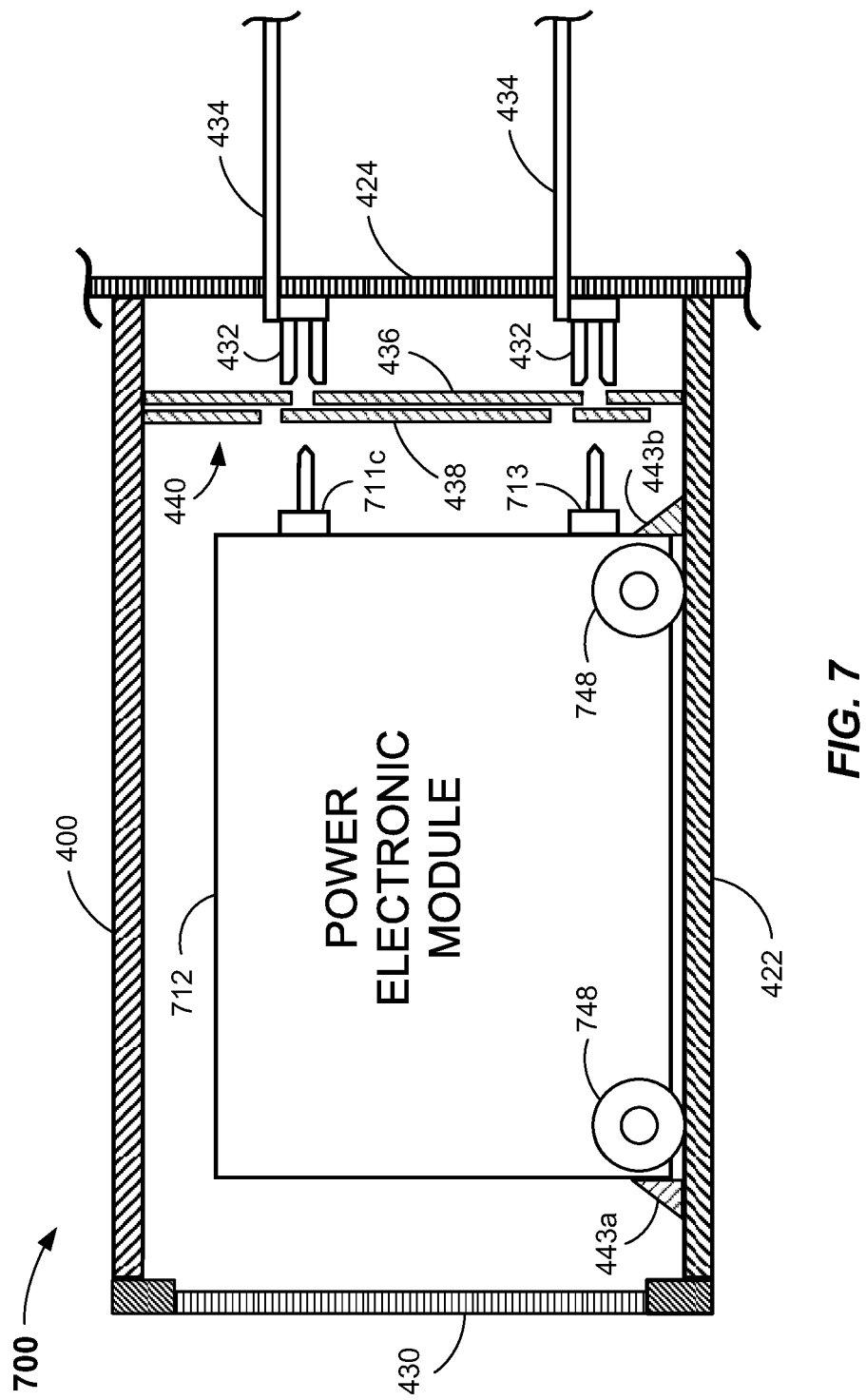
FIG. 7 illustrates a cross-sectional side view of a compartment and an alternative power electronic module of a power supply in a disconnected mode according to embodiments.

FIG. 7 illustrates a compartment 400 and a power electronic module 712 in a disconnected mode 700 in accordance with one or more embodiments. In some embodiments, power electronic module 712 may include bypass switches, such as, e.g., bypass switches 214-A2 and 214-A3, which may have to be set in bypass mode before power electronic module 712 may be moved to connect and/or disconnect the power electronic module 712 to and from stationary electrical connectors 432. In some embodiments, the power electronic module 712 may be equipped with one or more rollers or other similar parts that allow the power electronic module to move, i.e., roll. For example, power electronic module 712 may be equipped with four wheels 748 configured to roll along bottom wall 422 as power electronic module 712 is pushed by one of movable guides 443a and 443b of racking mechanism 442. Wheels 748 may be made of, e.g., rubber or other suitable non-conductive material. In addition to rollers, wheels, and the like, power electronic modules may alternatively have other parts or mechanisms that allow power electronic modules to move such as, e.g., a continuous or endless belt arrangement analogous to that found on construction equipment such as bulldozers. Discontinuous tracks may be used.

Similar to power electronic module 312 in disconnect mode 600, power electronic module 712 may have a plurality of electrical connectors (of which only electrical connectors 711c and 713 are shown) that may be aligned with the stationary electrical connectors 432, but may not yet engage the stationary electrical connectors 432 because movable shutter 438 may be in first position 440, which may inhibit electrical contact with the stationary electrical connectors 432. The electrical connectors of power electronic 712 may be identical or substantially similar to the electrical connectors of power electronic module 312. As in disconnect mode 600, interlock mechanism 547 may in some embodiments of disconnect mode 700 prevent racking mechanism 442 from moving power electronic module 712 while movable shutter 438 is in position 440.

Figure 8:
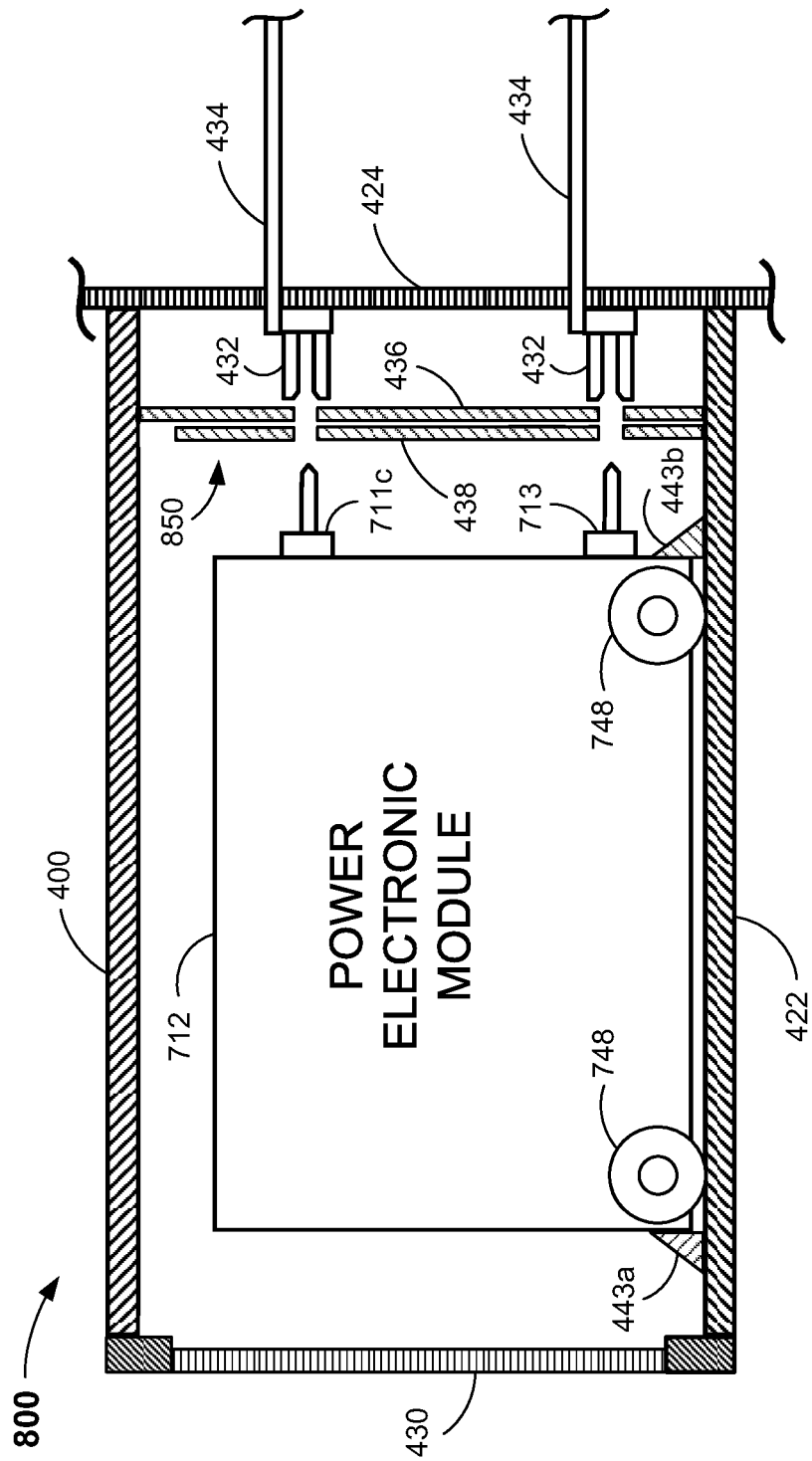
FIG. 8 illustrates a cross-sectional side view of a compartment and power electronic module of a power supply in a pre-connect/post-disconnect mode according to embodiments.

FIG. 8 illustrates a compartment 400 and power electronic module 712 in a pre-connect/post-disconnect mode 800 in accordance with one or more embodiments. After power electronic module 712 (or in other embodiments power electronic module 312) is placed in compartment 400 and door 430 is closed and latched, an operator may begin to move handle 544. This initial movement of handle 544 may cause movable shutter 438 to move into second position 850, which may allow the electrical connectors of power electronic module 712 to pass through movable shutter 438 and electrically connect with the stationary electrical connectors 432. That is, the pattern of slots and/or holes 439 of movable shutter 438 may line up with the pattern of slots and/or holes 437 of stationary shutter 436 and/or the stationary electrical connectors 432. Handle 544 may be operatively connected to movable shutter 438 in any suitable manner that causes movable shutter 438 to move from first position 440 to second position 850 in response to an initial movement of handle 544 in a first direction. In some embodiments, interlock mechanism 547 may prevent handle 544 from moving and/or may prevent movable shutter 438 from moving from first position 440 to second position 850 unless door 430 is closed and latched.

Figure 9:
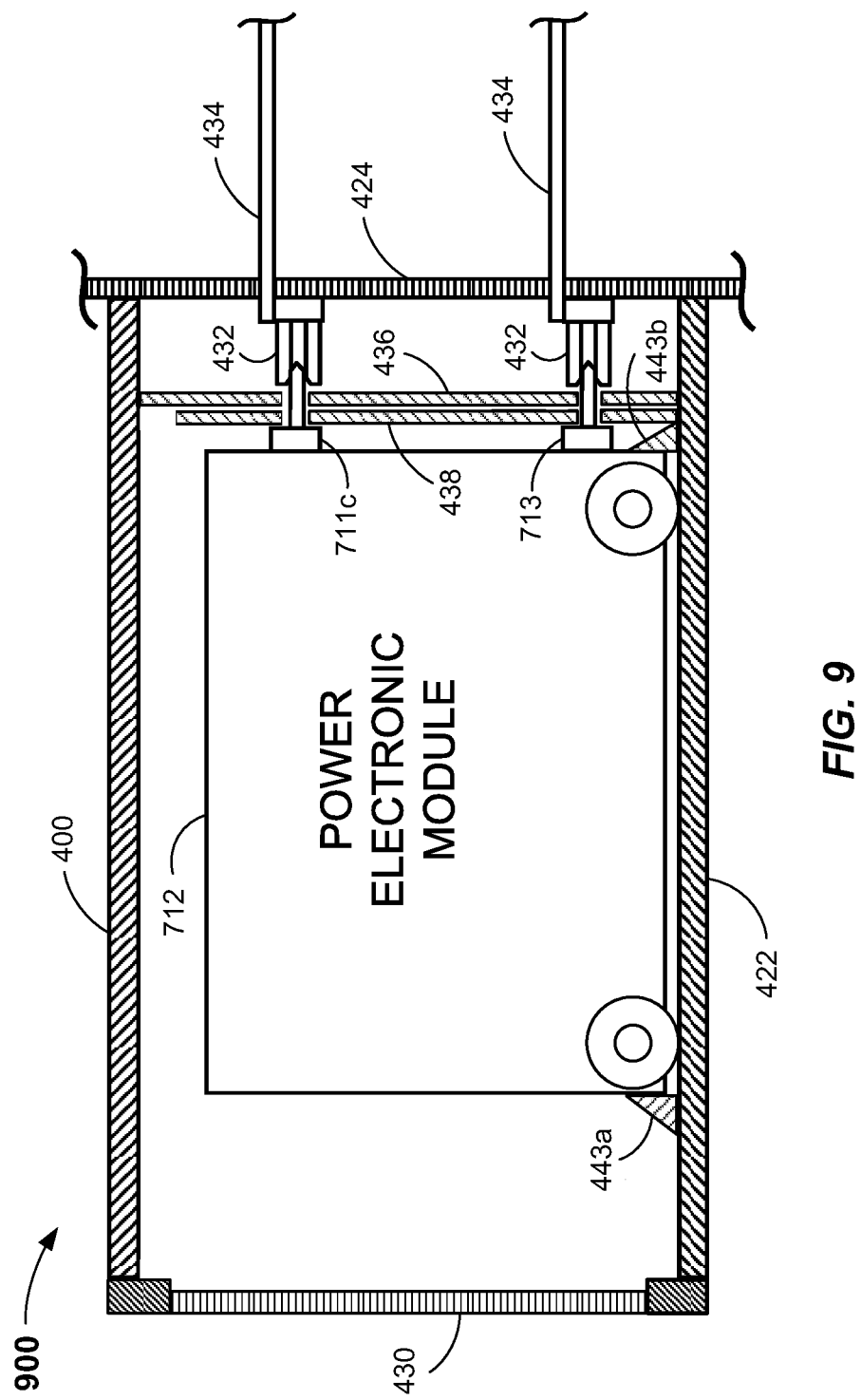
FIG. 9 illustrates a cross-sectional side view of a compartment and power electronic module of a power supply in a connected mode according to embodiments.

FIG. 9 illustrates a compartment 400 and power electronic module 712 in a connected mode 900 in accordance with one or more embodiments. In response to the operator continuing to move handle 544 in the first direction, movable guide 443a of racking mechanism 442 may push power electronic module 712 toward back wall 424 and the stationary electrical connectors 432. As power electronic module 712 moves toward the stationary electrical connectors 432, the electrical connectors of power electronic 712, including connectors 711c and 713, may pass through shutters 438 and 436 and may engage the stationary electrical connectors 432 to electrically connect thereto. Movement of handle 544 through its full range of motion in the first direction and the maximum length of travel toward back wall 424 provided by racking mechanism 442 may be designed and/or calibrated to ensure that power electronic module 712 moves just far enough to securely engage and electrically connect with the stationary electrical connectors 432. In some embodiments, movable guide 443b may act as a stop when movable guide 443b contacts movable shutter 438. Interlocking mechanism 547 may in some embodiments prevent racking mechanism 442 from moving power electronic module 712 unless movable shutter 438 is in second position 850. In some embodiments, circuits (not shown) to limit the inrush current into power electronic module 712 may be provided in compartment 400 and may be connected to, e.g., stationary electrical connectors 432.

Figure 10:
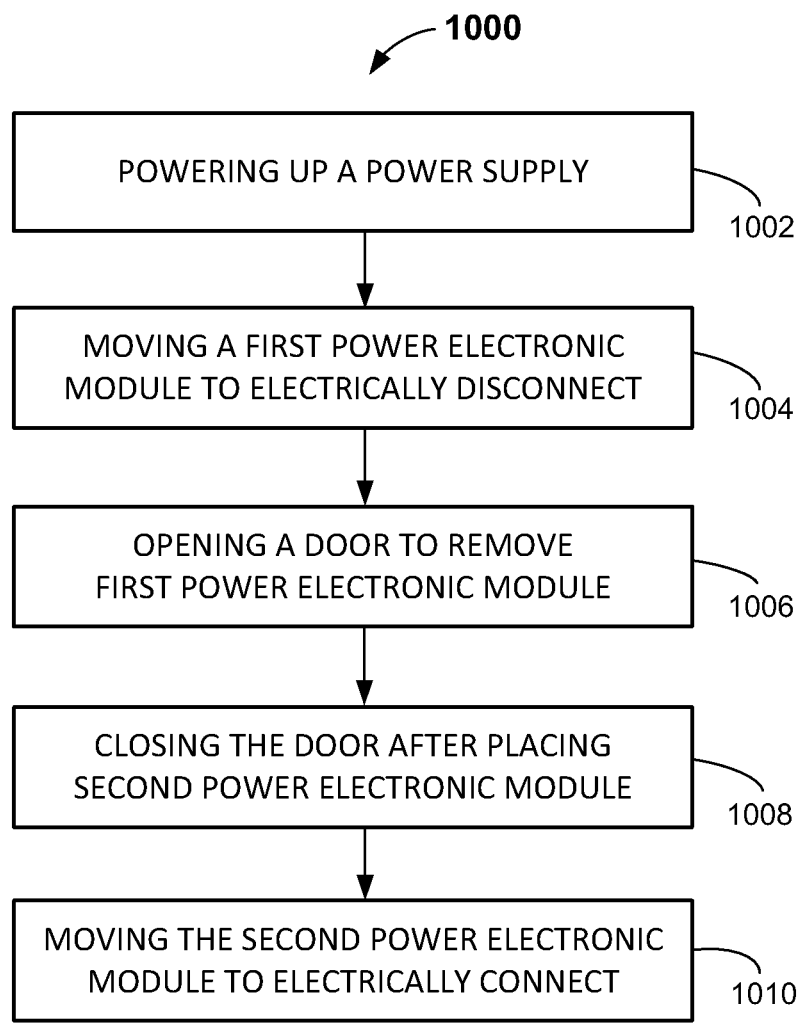
FIG. 10 illustrates a flowchart of a method of replacing a power electronic module in a power supply according to embodiments.

FIG. 10 illustrates a method of replacing a power electronic module in a power supply in accordance with one or more embodiments. At process block 1002, method 1000 may include powering up a power supply to output a voltage. The power supply may include a transformer such as, e.g., transformer 106. The power supply may also include a plurality of power electronic modules each enclosed in respective compartments 400. The power electronic modules may be, e.g., power electronic modules 312 and/or 712 and may be arranged as shown in FIG. 1 for power electronic modules 112 of power supply 100. The power supply may further include bypass circuitry such as shown in FIG. 2. The power supply may be, e.g., a medium-voltage power supply powered up to output a voltage ranging from, e.g., about 2,300 volts to about 14,000 volts. Alternatively, other power supplies having bypass circuitry and power electronic modules 312 and/or 712 enclosed in respective compartments 400 may be powered up to other suitable output voltages or ranges of output voltages.

At process block 1004, method 1000 may include moving a first power electronic module to electrically disconnect the first power electronic module from a plurality of stationary electrical connectors while the power supply outputs a voltage. For example, a first power electronic module, such as, e.g., power electronic module 712 of FIG. 9, may be moved using handle 544 to operate racking mechanism 442. As handle 544 may be moved in a first direction, racking mechanism 442 may cause power electronic module 712 to move away from the stationary electrical connectors 432 and toward front wall 428 and door 430. This movement may cause the electrical connectors of power electronic module 712 to electrically disconnect from the stationary electrical connectors 432 as power electronic module 712 moves from the connected mode 900 of FIG. 9 to the post-disconnect mode 800 of FIG. 8. As handle 544 is moved fully through its range of motion in the first direction, movable shutter 438 may move from second position 850 to first position 440. Power electronic module 712 may therefore move from the post-disconnect mode 800 of FIG. 8 to the disconnected mode 700 of FIG. 7.

At process block 1006, a door to a compartment enclosing the first power electronic module may be opened to remove the first power electronic module from the compartment while the power supply outputs a voltage. This may occur when the first power electronic module is in disconnected mode 600 or 700, as shown in FIGS. 6 and 7 for power electronic modules 312 and 712, respectively. With movable shutter 438 in first position 440 and the power electronic module moved away from stationary electrical connectors 432, interlock mechanism 547 may then allow door 430 to be unlatched and opened.

At process block 1008, the door to the compartment may be closed after a second power electronic module has been placed in the compartment while the power supply outputs a voltage. For example, with a second power electronic module such as power electronic module 312 or 712 placed in a compartment 400 as shown in FIG. 6 or 7, door 430 may be closed and latched.

At process block 1010, method 1000 may include moving the second power electronic module to electrically connect the second power electronic module to the plurality of stationary electrical connectors while the power supply outputs a voltage. For example, as shown in FIGS. 7-9, the second power electronic module 712 may be electrically connected to the stationary electrical connectors 432 by moving handle 544 in a second direction (which may be opposite the first direction). The initial movement of handle 544 may cause movable shutter 438 to move from first position 440 to second position 850, as shown in FIG. 8. Continued movement of handle 544 through its full range of motion in the second direction may cause racking mechanism 442 to move power electronic module 712 toward the stationary electrical connectors 432, allowing the electrical connectors of power electronic module 712 to pass through shutters 438 and 436 and electrically engage and connect with the stationary electrical connectors 432 as shown in FIG. 9.

The above process blocks of method 1000 may be executed or performed in an order or sequence not limited to the order and sequence shown and described. For example, in some embodiments, process blocks 1008 and 1010 may be performed before process blocks 1004 and 1006 (i.e., the second power electronic module becomes the first power electronic module and the first power electronic module becomes the second power electronic module). Also, some of the process blocks of method 1000 may be executed or performed substantially simultaneously or in parallel where appropriate or desired. For example, in some embodiments, process blocks 1004 and 1006 may be performed substantially simultaneously or in parallel with process blocks 1008 and 1010 where the first and second power electronic modules are enclosed in different compartments of a power supply.

Persons skilled in the art should readily appreciate that the invention described herein is susceptible of broad utility and application. Many embodiments and adaptations of the invention other than those described herein, as well as many variations, modifications, and equivalent arrangements, will be apparent from, or reasonably suggested by, the invention and the foregoing description thereof, without departing from the substance or scope of the invention. For example, although described in connection with medium voltage power supplies, one or more embodiments of the invention may be used with other types of power supplies and/or other types of electrical devices having electronic modules where replacement thereof while the electrical device remains under power is desirable. Accordingly, while the invention has been described herein in detail in relation to specific embodiments, it should be understood that this disclosure is only illustrative and presents examples of the invention and is made merely for purposes of providing a full and enabling disclosure of the invention. This disclosure is not intended to limit the invention to the particular apparatus, devices, assemblies, systems or methods disclosed, but, to the contrary, the intention is to cover all modifications, equivalents, and alternatives falling within the scope of the invention.

What is claimed is:

1. A power supply, comprising:
  a compartment configured to enclose a power electronic module therein, the compartment comprising:
    a plurality of walls completely enclosing the compartment, wherein each of the plurality of walls has an electrically grounded or insulated inside surface and one of the plurality of walls comprises an electrically grounded or insulated door providing access to inside of the compartment;
    a plurality of stationary electrical connectors;
    an insulated shutter having a first position configured to inhibit electrical contact with the plurality of stationary electrical connectors and a second position configured to allow electrical contact with the plurality of stationary electrical connectors; and
    a racking mechanism configured to move a power electronic module into or out of electrical contact with the stationary electrical connectors.

2. The power supply of claim 1, further comprising a power electronic module having a plurality of electrical connectors configured to electrically connect to at least some of the plurality of stationary electrical connectors.

3. The power supply of claim 2 wherein the plurality of electrical connectors comprises at least one male plug-in connector and the plurality of stationary electrical connectors comprises at least one corresponding female plug-in connector.

4. The power supply of claim 1 wherein the plurality of stationary electrical connectors are connectable without hand tools.

5. The power supply of claim 1, further comprising a power electronic module having at least one roller configured to allow the racking mechanism to move the power electronic module into or out of electrical contact with the stationary electrical connectors.

6. The power supply of claim 1 wherein the compartment further comprises a slider configured to:
move along one of the plurality of walls;
receive a power electronic module; and
allow the racking mechanism to move the slider such that the power electronic module moves into or out of electrical contact with the stationary electrical connectors.

7. The power supply of claim 1, further comprising a handle operatively connected to the racking mechanism such that movement of the handle causes the racking mechanism to move the power electronic module into or out of electrical contact with the stationary electrical connectors, the handle located outside the compartment.

8. The power supply of claim 1 wherein the racking mechanism is further configured to:
move the insulated shutter into the first position in response to the power electronic module moving out of electrical contact with the stationary electrical connectors; or
move the insulated shutter into the second position prior to the power electronic module moving into electrical contact with the stationary electrical connectors.

9. The power supply of claim 1, further comprising an interlock mechanism configured to inhibit the door from opening when the insulated shutter is in the second position.

10. The power supply of claim 1 wherein the stationary electrical connectors are positioned at or near one of the plurality of walls opposite the door.

11. The power supply of claim 1 wherein:
the plurality of walls comprises top, bottom, front, back, and side walls;
the front wall comprises the door; and
the compartment has a rectangular shape.

12. A power supply, comprising:
a transformer;
a plurality of power electronic modules each electrically coupled to the transformer and each configured to provide an output voltage; and
a plurality of compartments each enclosing a respective one of the plurality of power electronic modules and each comprising:
a plurality of stationary electrical connectors electrically connected to a respective one of the plurality of power electronic modules, and
a shutter having a first position inhibiting electrical contact with the plurality of stationary electrical connectors and a second position allowing electrical contact with the plurality of stationary electrical connectors;
wherein:
at least one of the plurality of power electronic modules is configured to move away and electrically disconnect from a respective one of the plurality of stationary electrical connectors while at least one other of the plurality of power electronic modules provides an output voltage; and
the shutter is configured to move into the first position in response to the at least one of the plurality of power electronic modules moving away and electrically disconnecting from the respective one of the plurality of stationary electrical connectors.

13. The power supply of claim 12 wherein:
a second one of the plurality of power electronic modules is configured to move toward and electrically connect to the respective one of the plurality of stationary electrical connectors while at least one other of the plurality of power electronic modules provides an output voltage; and
the shutter is configured to move into the second position in response to the second one of the plurality of power electronic modules moving toward and electrically connecting to the respective one of the plurality of stationary electrical connectors.

14. A method of replacing a power electronic module in a power supply, comprising:
powering up a power supply to output a voltage;
moving a first power electronic module to electrically disconnect the first power electronic module from a plurality of stationary electrical connectors while the power supply outputs a voltage;
opening a door to a compartment enclosing the first power electronic module to remove the first power electronic module from the compartment while the power supply outputs a voltage;
closing the door after a second power electronic module has been placed in the compartment while the power supply outputs a voltage; and
moving the second power electronic module to electrically connect the second power electronic module to the plurality of stationary electrical connectors while the power supply outputs a voltage.

15. The method of claim 14, further comprising:
moving a shutter to a first position that inhibits electrical contact with the plurality of stationary electrical connectors in response to electrically disconnecting the first power electronic module from the plurality of stationary electrical connectors while the power supply outputs a voltage; or
moving a shutter from the first position to a second position that allows electrical contact with the plurality of stationary electrical connectors in response to initiating the moving of the second power electronic module while the power supply outputs a voltage.

16. The method of claim 14 wherein the powering up of the power supply comprises powering up the power supply to output a voltage ranging from 2,300 volts to 14,000 volts.

17. The method of claim 14 wherein the moving of the first power electronic module comprises operating a racking mechanism configured to move the first power electronic module to electrically disconnect the first power electronic module from the plurality of stationary electrical connectors while the power supply outputs a voltage.

18. The method of claim 14 wherein the moving of the second power electronic module comprises operating a racking mechanism configured to move the second power electronic module to electrically connect the second power electronic module to the plurality of stationary electrical connectors while the power supply outputs a voltage.

19. The method of claim 14 wherein the moving of the first power electronic module comprises operating a handle mechanically connected to a racking mechanism to move the first power electronic module to electrically disconnect the first power electronic module from the plurality of stationary electrical connectors while the power supply outputs a voltage.

20. The method of claim 14 wherein the moving of the second power electronic module comprises operating a handle mechanically connected to a racking mechanism to move the second power electronic module to electrically connect the second power electronic module to the plurality of stationary electrical connectors while the power supply outputs a voltage.

* * * * *